(12) United States Patent
Koo et al.

(10) Patent No.: US 12,278,088 B2
(45) Date of Patent: Apr. 15, 2025

(54) PLASMA ANTENNA AND APPARATUS FOR GENERATING PLASMA HAVING THE SAME

(71) Applicant: SEMES CO., LTD., Cheonan-si (KR)

(72) Inventors: Il Gyo Koo, Cheonan-si (KR);
Harutyun Melikyan, Cheonan-si (KR);
Hyo Seong Seong, Changwon-si (KR);
Soojin Lee, Seoul (KR)

(73) Assignee: Semes Co., Ltd., Cheonan-Si (KR)

( * ) Notice: Subject to any disclaimer, the term of this patent is extended or adjusted under 35 U.S.C. 154(b) by 962 days.

(21) Appl. No.: 17/092,757

(22) Filed: Nov. 9, 2020

(65) Prior Publication Data

US 2021/0057185 A1 Feb. 25, 2021

Related U.S. Application Data

(60) Continuation of application No. 15/689,519, filed on Aug. 29, 2017, now abandoned, which is a division of application No. 14/091,605, filed on Nov. 27, 2013, now abandoned.

(30) Foreign Application Priority Data

Nov. 29, 2012 (KR) .................. 10-2012-0137143
Dec. 27, 2012 (KR) .................. 10-2012-0154646

(51) Int. Cl.
*H01L 21/3065* (2006.01)
*H01J 37/32* (2006.01)

(52) U.S. Cl.
CPC ...... *H01J 37/32091* (2013.01); *H01J 37/321* (2013.01); *H01J 37/3211* (2013.01); *H01J 37/32174* (2013.01); *H01J 37/32183* (2013.01)

(58) Field of Classification Search
CPC ............. H01J 37/321; H01J 37/3211; H01J 37/32174; H01J 37/32183; H01J 37/32119; H01J 37/32128; H01J 37/32137; H01J 37/32146; H01J 37/32155; H01J 37/32165; H05H 1/4645; H05H 1/4652
See application file for complete search history.

(56) References Cited

U.S. PATENT DOCUMENTS 5,346,578 A * 9/1994 Benzing ............. H01J 37/321
204/298.34
5,401,318 A * 3/1995 Pearson ............. H01J 37/3211
118/723 AN
5,643,639 A * 7/1997 Rudder ............. H01J 37/321
427/571

(Continued)

FOREIGN PATENT DOCUMENTS

CN 102403702 A 4/2012
CN 102509893 A 6/2012
(Continued)

*Primary Examiner* — Luz L Alejandro Mulero
(74) *Attorney, Agent, or Firm* — Harness, Dickey & Pierce, P.L.C.

(57) ABSTRACT

Provided are a plasma antenna and a plasma generating apparatus including the same. The plasma antenna includes a first antenna inducing electromagnetic fields by using an RF signal, a second antenna inducing electromagnetic fields by using the RF signal, and a capacitor connected between an input terminal of the first antenna and an input terminal of the second antenna.

18 Claims, 11 Drawing Sheets

(56) References Cited

U.S. PATENT DOCUMENTS

| | | | | |
|---|---|---|---|---|
| 5,907,221 A | * | 5/1999 | Sato | H01J 37/321 |
| | | | | 315/111.21 |
| 6,051,073 A | * | 4/2000 | Chu | H01J 37/321 |
| | | | | 118/723 MP |
| 2002/0018025 A1 | * | 2/2002 | Matsuda | H01Q 1/366 |
| | | | | 343/895 |
| 2002/0125828 A1 | * | 9/2002 | Doi | H01J 37/32082 |
| | | | | 315/111.21 |
| 2010/0095888 A1 | * | 4/2010 | Mori | C23C 16/509 |
| | | | | 315/111.21 |
| 2011/0023780 A1 | * | 2/2011 | Ramaswamy | H01P 7/04 |
| | | | | 333/32 |
| 2011/0094994 A1 | * | 4/2011 | Todorow | H01J 37/3244 |
| | | | | 216/68 |
| 2011/0104902 A1 | * | 5/2011 | Yamazawa | H01J 37/3211 |
| | | | | 438/758 |
| 2012/0090785 A1 | * | 4/2012 | Jang | H01J 37/3211 |
| | | | | 156/345.48 |

FOREIGN PATENT DOCUMENTS

| | | |
|---|---|---|
| CN | 102573262 A | 7/2012 |
| KR | 20120040335 A | 4/2012 |
| WO | WO-2012007148 A1 | 1/2012 |

* cited by examiner

PLASMA ANTENNA AND APPARATUS FOR GENERATING PLASMA HAVING THE SAME

CROSS-REFERENCE TO RELATED APPLICATIONS

This U.S. non-provisional patent application is a continuation of U.S. application Ser. No. 15/689,519, filed on Aug. 29, 2017, which is a divisional of U.S. application Ser. No. 14/091,605, filed on Nov. 27, 2013, which claims priority under 35 U.S.C. § 119 of Korean Patent Application Nos. 10-2012-0137143 filed on Nov. 29, 2012; and 10-2012-0154646 filed on Dec. 27, 2012, the entire contents of each of which are hereby incorporated by reference.

BACKGROUND OF THE INVENTION

The present invention disclosed herein relates to a plasma antenna and an apparatus for generating plasma having the same.

A process for manufacturing semiconductors, displays, solar cells, and the like includes a process for treating a substrate by using plasma. For example, in the semiconductor manufacturing process, an etching device used for a dry etching process and an ashing device used for an ashing process may include a chamber for generating plasma. A substrate may be etched or ashed by using the plasma.

Typically, a plasma generating apparatus may apply time-varying current to an antenna installed in the chamber to induce electrical fields and then converts a gas injected into the chamber into a plasma state by using the induced electrical fields, thereby generating plasma.

SUMMARY OF THE INVENTION

The present invention provides a plasma antenna for electrically coupling two antennas constituting a dual antenna to each other and a plasma generating apparatus including the same.

The present invention also provides a plasma antenna for maintaining balance of current flowing into two antennas and a plasma generating apparatus including the same.

Embodiments of the present invention provide plasma antenna including: a first antenna inducing electromagnetic fields by using an RF signal; a second antenna inducing electromagnetic fields by using the RF signal; and a capacitor connected between an input terminal of the first antenna and an input terminal of the second antenna.

In some embodiments, the first antenna may include a first RF feed receiving the RF signal and having a pillar shape and a first coil connected to the first RF feed, and the second antenna may include a second RF feed receiving the RF signal and having a hollow pillar shape surrounding the first RF feed and a second coil connected to the second RF feed.

In other embodiments, the capacitor may be constituted by the first RF feed, the second RF feed, and a dielectric disposed between the first RF feed and the second RF feed.

In still other embodiments, the first RF feed may have a cylindrical shape, and the second RF feed may have a hollow cylindrical shape surrounding the cylindrical shape.

In even other embodiments, the first and second RF feeds may be coaxially disposed with respect to each other.

In yet other embodiments, the dielectric may include a polymer or metal oxide.

In further embodiments, the polymer may include Teflon, ULTEM, or polyetheretherketone (PEEK).

In still further embodiments, the metal oxide may include ceramic.

In even further embodiments, the ceramic may include $Al_2O_3$ or ZnO.

In yet further embodiments, the plasma antenna may include a plurality of capacitors along a longitudinal axis of each of the first and second RF feeds.

In much further embodiments, the plurality of capacitor may be constituted by the first RF feed, the second RF feed, and a plurality of dielectrics disposed between the first and second RF feeds.

In still much further embodiments, the plurality of dielectrics may be spaced a predetermined distance from each other along the longitudinal axis.

In even much further embodiments, the plurality of dielectrics may be different in material.

In yet much further embodiments, the capacitor may include: a first conductor having a pillar shape, the first conductor being coaxially disposed with respect to the first RF feed; a second conductor has a hollow pillar shape surrounding the first conductor, the second conductor being coaxially disposed with respect to the second RF feed.

In yet much still further embodiments, the capacitor may be attachable to at least one of the first and second antennas.

In other embodiments of the present invention, plasma generating apparatuses include: an RF power source providing an RF signal; a plasma chamber in which a gas is injected to generate plasma; and a plasma antenna disposed on the plasma chamber, the plasma receiving the RF signal to induce electromagnetic fields in the plasma chamber, wherein the plasma antenna includes: a first antenna inducing electromagnetic fields by using the RF signal; a second antenna inducing electromagnetic fields by using the RF signal; and a capacitor connected between an input terminal of the first antenna and an input terminal of the second antenna.

In some embodiments, the plasma antenna may be disposed on an upper portion of the plasma chamber.

In other embodiments, the first and second antennas may be inductively coupled to each other.

In still other embodiments, the first and second antennas may be connected to each other in parallel.

In even other embodiments, the first antenna may include a first RF feed receiving the RF signal and having a pillar shape and a first coil connected to the first RF feed, and the second antenna may include a second RF feed receiving the RF signal and having a hollow pillar shape surrounding the first RF feed and a second coil connected to the second RF feed.

In yet other embodiments, the capacitor may be constituted by the first RF feed, the second RF feed, and a dielectric disposed between the first RF feed and the second RF feed.

In further embodiments, the dielectric may include a polymer or metal oxide.

In still further embodiments, the polymer may include Teflon, ULTEM, or polyetheretherketone (PEEK).

In even further embodiments, the metal oxide may include ceramic.

In yet further embodiments, the ceramic may include $Al_2O_3$ or ZnO.

In much further embodiments, the capacitor may include: a first conductor having a pillar shape, the first conductor being coaxially disposed with respect to the first RF feed; a second conductor has a hollow pillar shape surrounding the first conductor, the second conductor being coaxially disposed with respect to the second RF feed.

In still much further embodiments, the capacitor may be attachable to at least one of the first and second antennas.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

If not defined otherwise, all of the terms used (including technical or scientific terms) are equivalent to the counterparts as understood generally by one in the killed in the art. Usual terms as defined in the dictionary are to be interpreted correspondingly to the context of the related technology rather than ideally or excessively formally unless the present invention clearly defines the same.

In the following description, the technical terms are used only for explaining a specific exemplary embodiment while not limiting the present invention. The terms of a singular form may include plural forms unless specifically mentioned. The meaning of 'comprises' and/or 'comprising' specifies a composite, component, element, process, operation and/or device but does not exclude other composites, components, elements, processes, operations and/or devices. In the specification, 'and/or' means that it includes at least one of listed components.

Hereinafter, exemplary embodiments will be described in detail with reference to the accompanying drawings.

Figure 1:
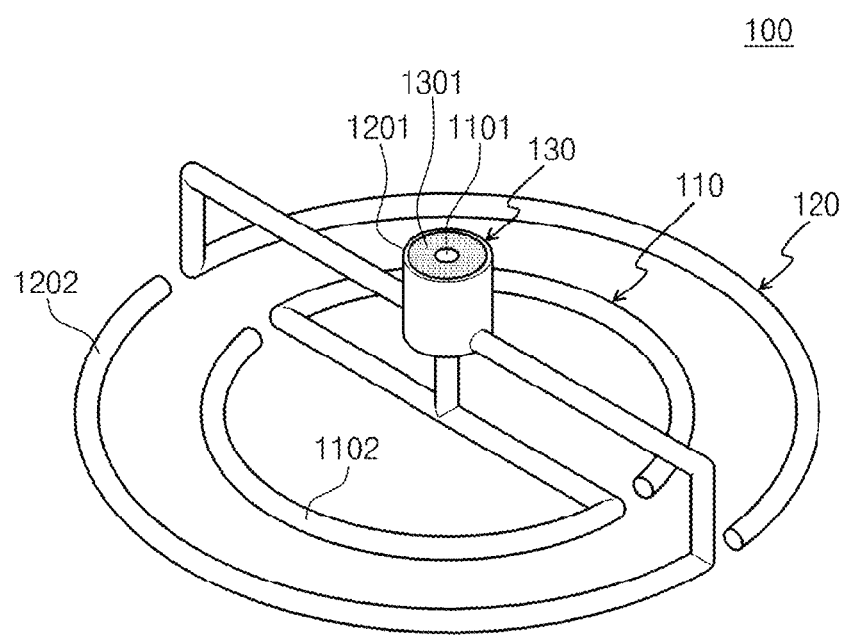
FIG. 1 is a perspective view of a plasma antenna according to an embodiment of the present invention.
Figure 2:
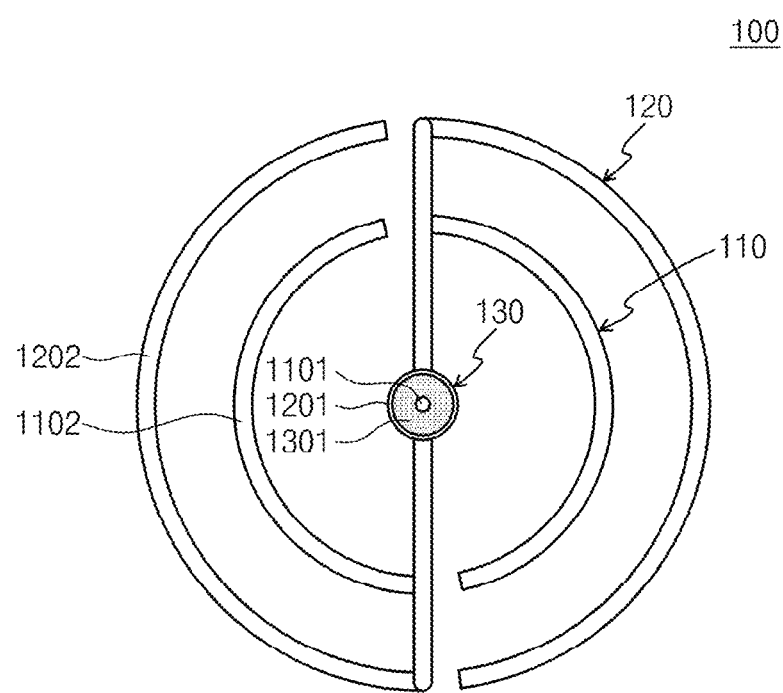
FIG. 2 is a plan view of the plasma antenna according to an embodiment of the present invention.

FIG. 1 is a perspective view of a plasma antenna according to an embodiment of the present invention, and FIG. 2 is a plan view of the plasma antenna according to an embodiment of the present invention.

Referring to FIGS. 1 and 2, a plasma antenna 100 according to an embodiment of the present invention may include a first antenna 110, a second antenna 120, and a capacitor 130.

The first antenna 110 may induce electromagnetic fields by using an RF signal. The second antenna 120 may also induce electromagnetic fields by using the RF signal. The capacitor 130 may be connected between an input terminal of the first antenna 110 and an input terminal of the second antenna 120.

The first antenna 110 may include a first RF feed 1101 and a first coil 1102 connected to the first RF feed 1101. The second antenna 120 may include a second RF feed 1201 to which the RF signal is applied and a second coil 1202 connected to the second RF feed 1201.

According to an embodiment of the present invention, the first RF feed 1101 may be a conductor having a pillar shape. The second RF feed 1201 may be a conductor having a hollow pillar shape surrounding the first RF feed 1101.

As shown in FIGS. 1 and 2, the first RF feed 1101 may have a cylinder shape, and the second RF feed 1201 may have a hollow cylinder shape surrounding the cylinder, but the present invention is not limited thereto. For example, the first RF feed 1101 may have a prism shape, and the second RF feed 1201 may have a hollow prism shape surrounding the prism shape.

As shown in FIGS. 1 and 2, the first RF feed 1101 may have the same bottom shape as the second RF feed 1201, but the present invention is not limited thereto. For example, the RF feeds 1101 and 1201 may have bottom shapes different from each other.

As shown in FIGS. 1 and 2, the first and second RF feeds 1101 and 1201 may be coaxially disposed with respect to each other. According to embodiments, central axes of the two RF feeds 1101 and 1201 may be misaligned with respect to each other. For example, the central axes of the first and second RF feeds 1101 and 1201 may be spaced a preset distance from each other and disposed parallel to each other.

According to an embodiment of the present invention, the capacitor 130 may be constituted by the first RF feed 1101, the second RF feed 1201, and a dielectric 1301 disposed between the first and second RF feeds 1101 and 1201. For example, as shown in FIGS. 1 and 2, the capacitor 130 may be manufactured by filling the dielectric 1301 between the first and second RF feeds 1101 and 1201.

As a result, the plasma antenna 100 according to the embodiment of the present invention may be configured to connect the capacitor 130 between the input terminal of the first antenna 110 and the input terminal of the second antenna 120.

According to an embodiment, the dielectric 1301 may have a dielectric constant greater than that of air. For example, the dielectric 1301 may be formed of polymer or metal oxide. According to embodiments, the dielectric 1301 may be formed of a material having dielectric constant greater than air in addition to the polymer or metal oxide.

According to an embodiment, the polymer may be Teflon, ULTEM, or polyetheretherketone (PEEK), but the present invention is not limited thereto. For example, the polymer may include other polymer materials in addition to Teflon, ULTEM, and PEEK.

According to an embodiment, the metal oxide may be ceramic, but the present invention is not limited thereto. For example, the metal oxide may include various metal oxides in addition to the ceramic.

According to an embodiment, the ceramic may be formed of $Al_2O_3$ or ZnO, but the present invention is not limited thereto. For example, the ceramic may be formed of various metal oxides in addition to $Al_2O_3$ and ZnO.

Figure 3:
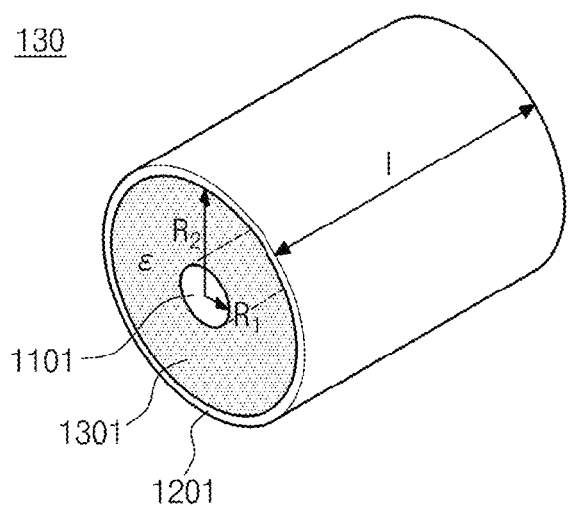
FIG. 3 is a perspective view of a capacitor according to an embodiment of the present invention.

FIG. 3 is a perspective view of the capacitor 130 according to an embodiment of the present invention.

Referring to FIG. 3, the capacitor 130 may include a first RF feed 1101, a second RF feed 1201 surrounding the first RF feed 1101, and a dielectric material 1301 disposed between the first RF feed 1101 and the second RF feed 1201.

The first RF feed 1101 has a cylindrical shape of which a bottom surface has a radius $R_1$, and a height is 1. The second RF feed 1201 has a hollow cylindrical shape of which a bottom surface has a radius $R_2$, and a height is 1. When the dielectric material 1301 may have a dielectric constant $\varepsilon$, air has a dielectric constant $\varepsilon_0$, a capacitance of the capacitor 130 may be as follows.

$$C = \frac{2\pi\varepsilon\varepsilon_0 l}{\ln\frac{R_2}{R_1}} \qquad \text{[Mathematical equation 1]}$$

Figure 4:
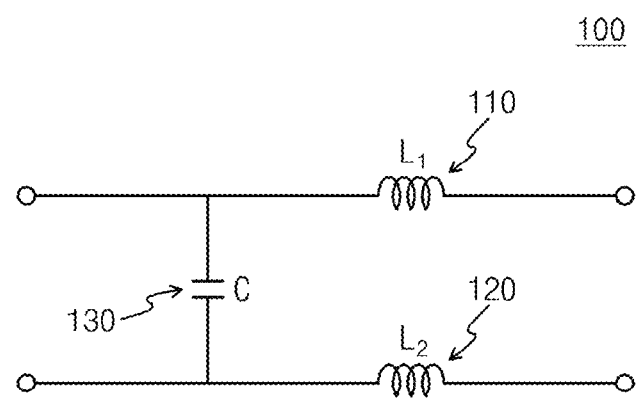
FIG. 4 is a circuit diagram of the plasma antenna according to an embodiment of the present invention.

FIG. 4 is a circuit diagram of the plasma antenna 100 according to an embodiment of the present invention.

Referring to FIG. 4, the first antenna 110 of the plasma antenna 100 may be provided as an inductor having an inductance L1, and the second antenna 120 may be provided as an inductor having an inductance L2. The capacitor 130 may be disposed between input terminals of the two inductors and be provided as a capacitor having a capacitance C.

Figure 5:
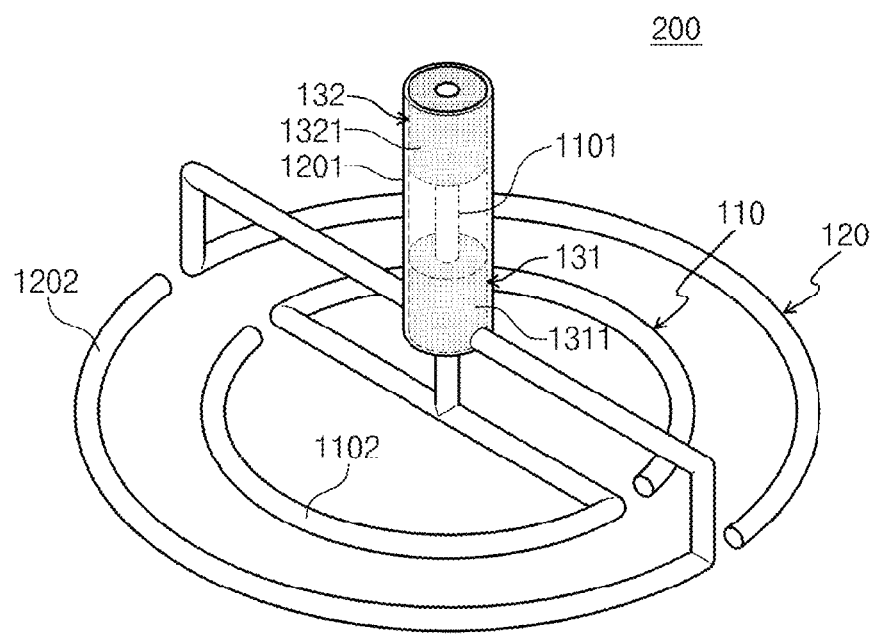
FIG. 5 is a perspective view of a plasma antenna according to another embodiment of the present invention.

FIG. 5 is a perspective view of a plasma antenna according to another embodiment of the present invention.

Referring to FIG. 5, a plasma antenna 200 according to an embodiment may include a first antenna 110 and a second antenna 120. However, the plasma antenna 200 may be different from the plasma antenna FIG. 1 in that the plasma antenna 200 includes a plurality of capacitors 131 and 132 along longitudinal axes of first and second RF feeds 1101 and 1201. Here, the longitudinal axis represents a central axis of the first or second RF feed 1101 or 1201.

According to an embodiment, the plurality of capacitors 131 and 132 may be constituted by the first RF feed 1101, the second RF feed 1201, and a plurality of dielectrics 1311 and 1321 disposed between the first and second RF feeds 1101 and 1201.

As shown in FIG. 5, the plurality of dielectrics 1311 and 1321 may be spaced a preset distance from each other along the longitudinal axis, but the present invention is not limited thereto. For example, the plurality of dielectrics 1311 and 1321 may be disposed adjacent to each other.

According to an embodiment, the plurality of dielectrics 1311 and 1321 may be materials different from each other. For example, the first dielectric 1311 may be Teflon, and the second dielectric 1321 may be ceramic.

Although the plasma antenna 200 of FIG. 5 includes the two capacitors 131 and 132, the present invention is not limited to the number of capacitors. For example, the plasma antenna 200 may include at least three capacitors.

Figure 6:
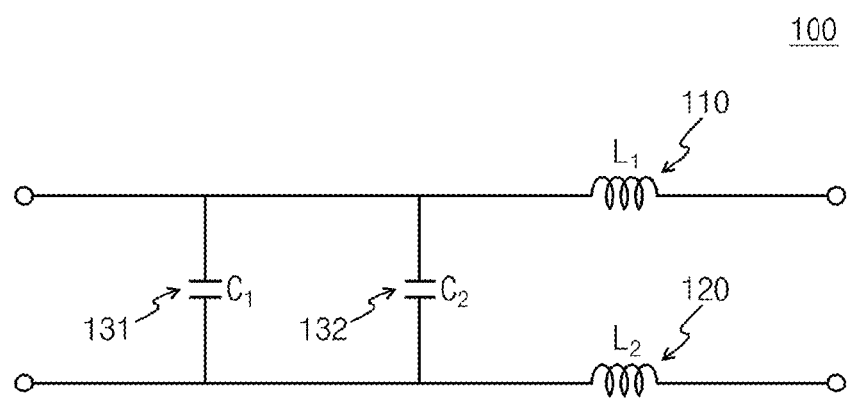
FIG. 6 is a circuit diagram of the plasma antenna according to another embodiment of the present invention.

FIG. 6 is a circuit diagram of the plasma antenna 200 according to another embodiment of the present invention.

Referring to FIG. 6, the plasma antenna 200 may include a first antenna 110 provided as an inductor having an inductance L1 and a second antenna 120 provided as an inductor having an inductance L2. Also, a plurality of capacitors 131 and 132 connected to each other in parallel may be disposed between input terminals of the two inductors.

The capacitors 131 and 132 may have capacitances C and C2, respectively. Also, if the capacitors 131 and 132 have the same structure, size, and dielectric as each other, the capacitances C1 and C2 may be the same.

Figure 7:
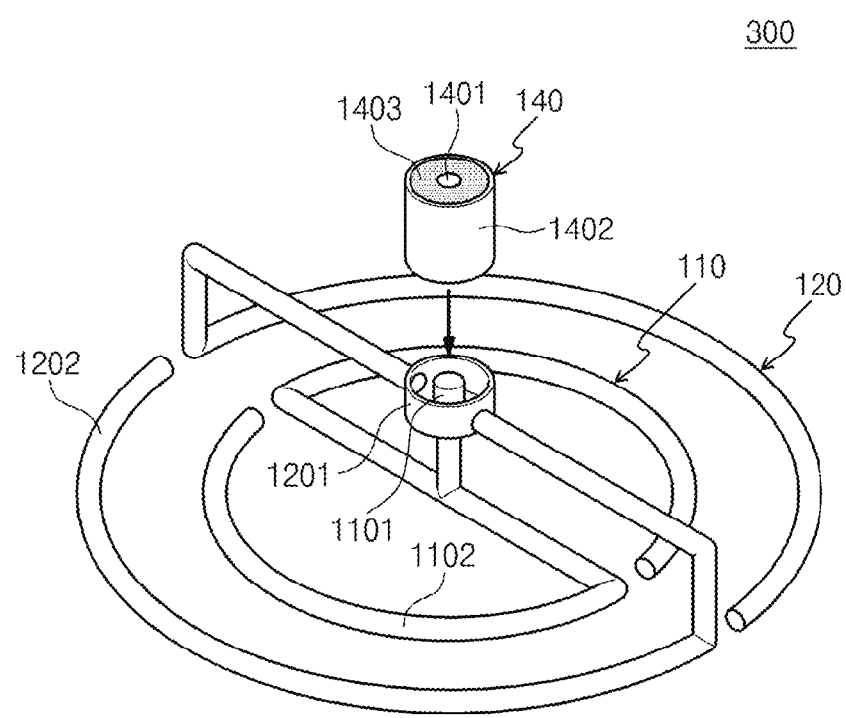
FIG. 7 is a perspective of a plasma antenna according to further another embodiment of the present invention.

FIG. 7 is a perspective of a plasma antenna according to further another embodiment of the present invention.

Referring to FIG. 7, a plasma antenna 300 according to another embodiment of the present invention may include a first antenna 110 and a second antenna 120. However, the plasma antenna 300 may be different from the plasma antenna FIG. 1 in that a capacitor 140 is detachably fixed to the antenna 300.

As shown in FIG. 7, the capacitor 140 may include a first conductor 1401 having a pillar shape and coaxially disposed with respect to a first RF feed 1101, a second conductor 1402 having a hollow pillar shape surrounding the first conductor 1401 and coaxially disposed with respect to a second RF feed 1201, and a dielectric 1403 disposed between the first conductor 1401 and the second conductor 1402.

The first conductor 1401 may have the same shape and size as a bottom surface of the first RF feed 1101, and the second conductor 1402 may have the same shape and size as a bottom surface of the second RF feed 1201.

The capacitor 140 may be separately manufactured with respect to the first and second antennas 110 and 120 and then be assembled with at least one of the first and second antennas 110 and 120.

Figure 8:
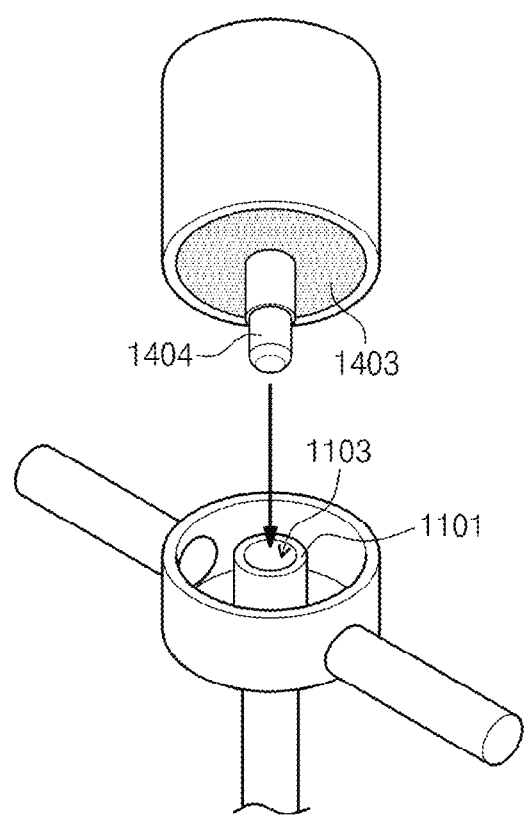
FIG. 8 is an enlarged view illustrating an example of an assembled portion of the plasma antenna according to further another embodiment of the present invention.

FIG. 8 is an enlarged view illustrating an example of an assembled portion of the plasma antenna 300 according to further another embodiment of the present invention. Referring to FIG. 8, the capacitor 140 may be detachably disposed on the first antenna 110.

For example, the capacitor 140 may include a protrusion 1404 protruding from an end of the first conductor 1401. The first RF feed 1101 may include a recess part for accommodating the protrusion in an end thereof. The protrusion 1404 and the recess part 1103 may be complementarily formed with respect to each other.

According to an embodiment, when the protrusion 1404 is inserted into the recess part 1103, the protrusion 1404 and the recess part 1403 may be coupled to each other in an interference fit manner to improve coupling force between the capacitor 140 and the first antenna 110.

Although not shown, the first conductor 1401 may include a recess part that is the same as the recess part 1103 of the first RF feed 1101 in the other end thereof. The recess part provided in the other end of the first conductor 1401 may accommodate a protrusion 1404 of the other capacitor. Thus, the plasma antenna 300 may include at least two capacitors connected to each other.

Figure 9:
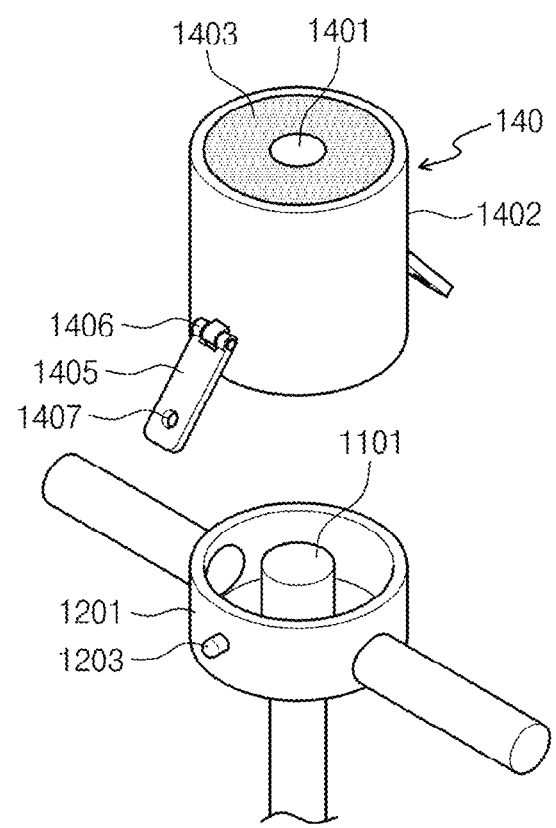
FIG. 9 is an enlarged view illustrating an example of an assembled portion of a plasma antenna according to further another embodiment of the present invention.

FIG. 9 is an enlarged view illustrating an example of an assembled portion of the plasma antenna 300 according to further another embodiment of the present invention. Referring to FIG. 9, the capacitor 140 may be detachably disposed on the second antenna 120.

For example, the capacitor 140 may include a fixing unit connected to the second conductor 1402. The fixing unit 1405 may be disposed outside the second conductor 1402 by a connection unit 1406 such as a hinge, but the connection unit is not limited to the hinge. For example, the connection unit may include various units according to embodiments. The fixing unit 1405 may include a groove 1407.

The second RF feed 1201 may include a projection 1203 on an outer surface thereof. The projection 1203 and the groove 1407 may be complementarily formed with respect to the each other.

Figure 10:
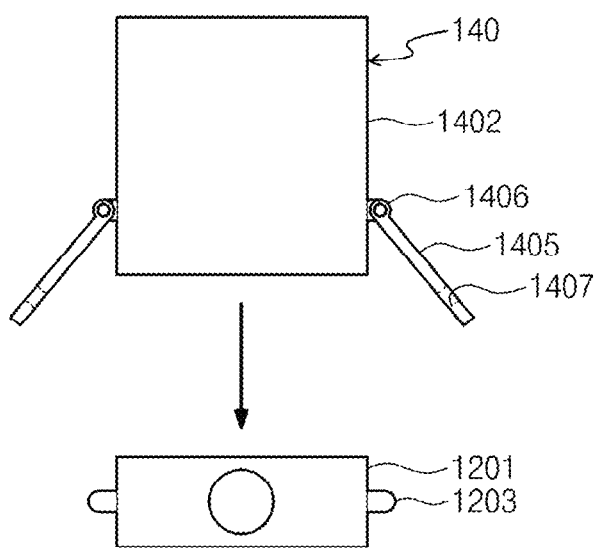
FIGS. 10 to 12 are side views for explaining a process of assembling the plasma antenna of FIG. 9.
Figure 11:
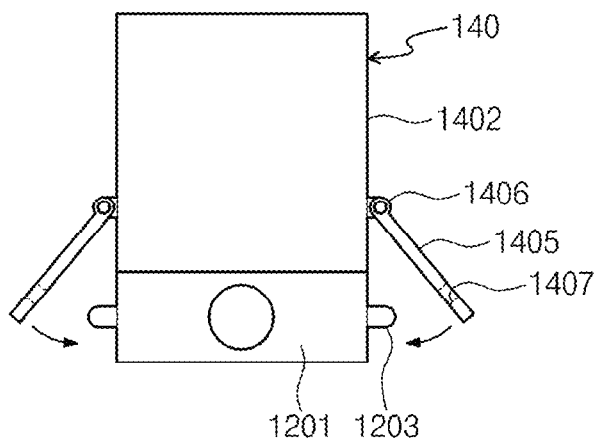
Figure 12:
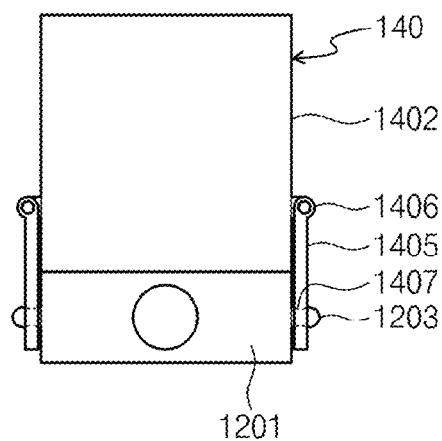

FIGS. 10 to 12 are side views for explaining a process of assembling the plasma antenna 300 of FIG. 9.

Referring to FIG. 10, the capacitor 140 may be coaxially disposed with respect to the first and second RF feeds 1101 and 1201. When the capacitor 140 is coaxially disposed with respect to the first and second RF feeds 1101 and 1201, the first conductor 1401 of the capacitor 140 may contact the first RF feed 1101 of the first antenna 110, and also, the second conductor 1402 of the capacitor 140 may contact the second RF feed 1201 of the second antenna 120.

Then, as shown in FIG. 11, the fixing unit 1405 of the capacitor 140 may move toward the projection 1203 of the second antenna 120. As shown in FIG. 11, when the fixing unit 1405 is connected to the second conductor 1402 by the connection unit 1406, the fixing unit 1405 may rotate around a connection portion therebetween.

Then, as shown in FIG. 12, the projection 1203 may be inserted into the groove 1407 defined in the fixing unit 1405 to fix the capacitor 140 to the antenna. According to an embodiment, the projection 1203 and the groove 1407 may be fixed to each other in the interference fit manner to improve coupling force between the capacitor 140 and the second antenna 120.

Although the plasma antenna 300 of FIGS. 10 to 12 includes two sets of fixing unit 1405 and projection 1203, the present invention is not limited to the number of fixing unit and projection. For example, the plasma antenna 300 may include at least three fixing units and projections.

Although not shown, the second conductor 1402 may also further include a projection having the same shape as the projection 1203 of the second RF feed 1201. The projection provided on the second conductor 1402 may be engaged with a fixing unit 1405 of the other capacitor. Thus, the plasma antenna 30 may include at least two capacitors connected to each other.

According to an embodiment, the plasma antenna 300 may include the assembled structure of FIG. 8 and the assembled structure of FIGS. 9 to 12. That is, the capacitor 140 may be detachably coupled to all of the first and second antennas 110 and 120.

Figure 13:
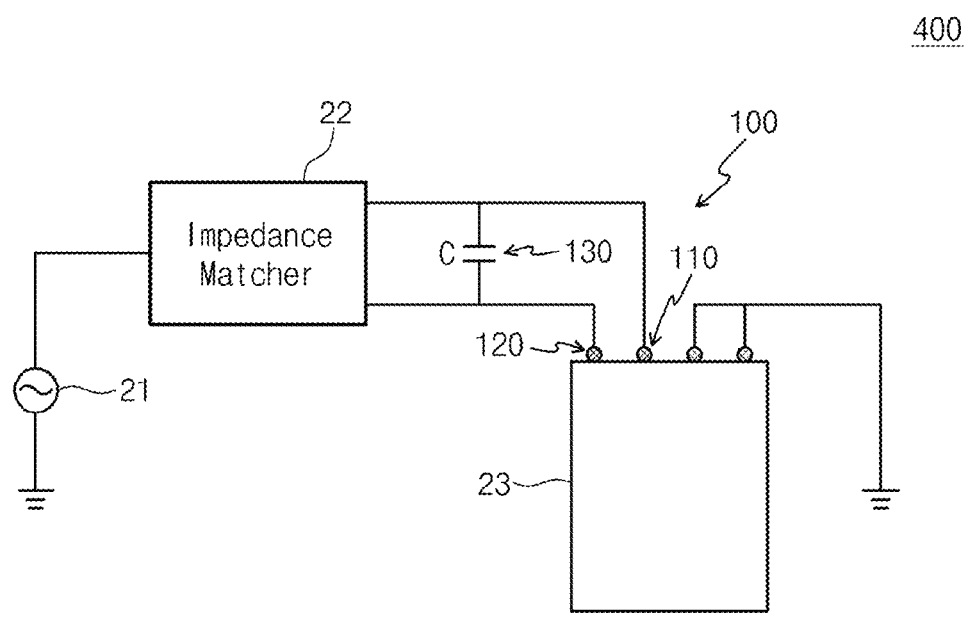
FIG. 13 is a view of a plasma generating apparatus according to an embodiment of the present invention.

FIG. 13 is a view of a plasma generating apparatus according to an embodiment of the present invention.

As shown in FIG. 13, the plasma generating apparatus 400 may include an RF power source 21, a plasma chamber 23, and a plasma antenna. The plasma generating apparatus 400 may include the above-described plasma antenna 100, 200, or 300 to generate plasma in the plasma chamber 23.

The RF power source 21 may provide an RF signal. A gas may be injected into the plasma chamber 23 to generate plasma. The plasma antenna 100 may be disposed on the plasma chamber 23 to receive the RF signal, thereby inducing electromagnetic fields in the plasma chamber 23.

According to an embodiment, the RF power source 21 may generate the RF signal to transmit the RF signal to the plasma antenna 100. The RF power source 21 may transmit high-frequency power to the plasma chamber 23 through the RF signal. According to an embodiment of the present invention, the RF power source 21 may generate an RF signal having a sinusoidal wave to output the RF signal. However, the present invention is not limited thereto. For example, the RF power source 301 may generate various waves such as a square wave, a triangle wave, a triangle wave, a pulse wave, and the like.

According to an embodiment, the plasma chamber 23 may receive a gas generate plasma by using the injection gas. The plasma chamber 23 may change the gas injected into the chamber into a plasma state by using high-frequency power transmitted through the RF signal.

According to an embodiment, as shown in FIG. 13, the plasma antenna 100 disposed on an upper portion of the plasma chamber 23, but the present invention is not limited to the installed position of the plasma antenna 100. For example, the plasma antenna 100 may be disposed on a side surface of the plasma chamber 23.

The plasma antenna 100 may be a dual antenna including a plurality of antennas. For example, the plasma antenna 100 may include a first antenna 110 inducing electromagnetic fields by using the RF signal, a second antenna 120 inducting electromagnetic fields by using the RF signal, and a capacitor 130 connected between an input terminal of the first antenna 110 and an input terminal of the second antenna 120.

The first and second antenna 110 and 120 may be inductively coupled to each other. That is, the magnetic fields induced by the first antenna 110 and the magnetic fields induced by the second antenna 120 may affect each other. As a result, the first antenna 110 and the second antenna 120 may have a mutual inductance M.

According to an embodiment, the first antenna 110 and the second antenna 120 may be connected to the RF power source 21 in parallel.

The first antenna 110 may include a first RF feed 1101 receiving the RF signal from the RF power source 21 and having a pillar shape and a first coil 1102 connected to the first RF feed 1101. The second antenna 120 may include a second RF feed 1201 receiving the RF signal from the RF power source 21 and having a hollow pillar shape surrounding the first RF feed 1101 and a second coil 1202 connected to the second RF feed 1201.

The plasma antenna 100 may include a capacitor 130 disposed between the input terminal of the first antenna 110 and the input terminal of the second antenna 120. The capacitor 130 may be constituted by the first RF feed 1101, the second RF feed 1201, and a dielectric 1301 disposed between the first RF feed 1101 and the second RF feed 1201. The dielectric 1301 may be one of Teflon, ULTEM, polyetheretherketone (PEEK), and ceramic.

According to an embodiment, the capacitor 130 may be integrated with the first and second antennas 110 and 120. According to another embodiment, the capacitor may be separately provided with respect to the first and second antennas.

For example, the capacitor 140 may include a first conductor 1401 coaxially disposed with respect to the first RF feed 1101, a second conductor 1402 having a hollow pillar shape surrounding the first conductor 1401 and coaxially disposed with respect to the second RF feed 1201, and a dielectric 1403 disposed between the first conductor 1401 and the second conductor 1402.

The capacitor 140 may be detachably coupled to at least one of the first and second antennas 110 and 120.

According to an embodiment of the present invention, the plasma generating apparatus 400 may further include an impedance matcher 22. As shown in FIG. 13, the impedance matcher 22 may be connected between the RF power source 21 and the plasma antenna 100. The impedance matcher 22 may match an output impedance viewed from an output terminal of the RF power source 21 with an input impedance viewed from an input terminal of the plasma antenna 100 to minimize loss of the high-frequency power outputted from the RF power source 21, thereby transmitting maximum power to the chamber.

Figure 14:
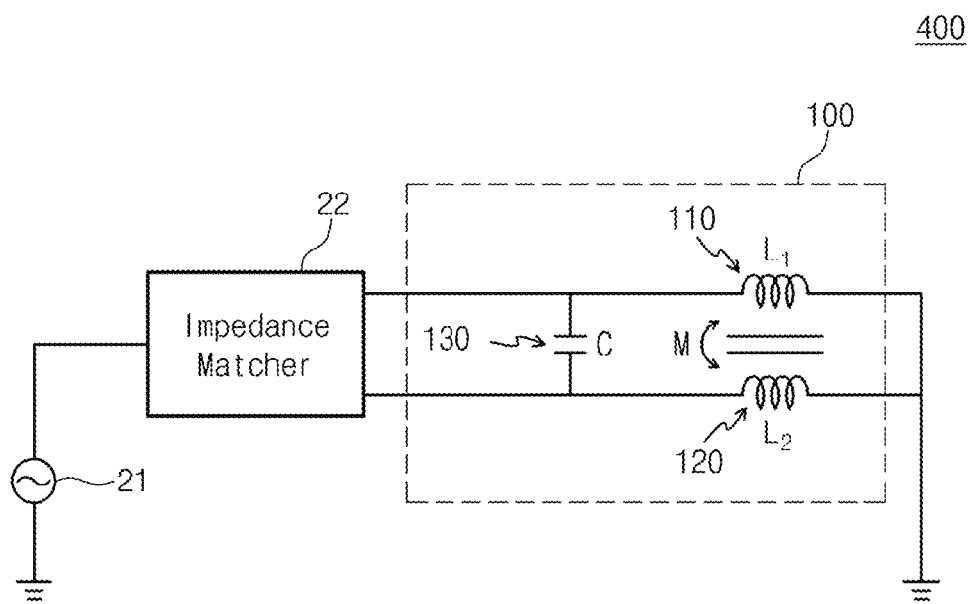
FIG. 14 is a circuit diagram of the plasma generating apparatus according to an embodiment of the present invention.

FIG. 14 is a circuit diagram of a plasma generating apparatus 400 according to an embodiment of the present invention.

Referring to FIG. 14, when a first antenna 110 and a second antenna 120 are inductively coupled to each other to allow electromagnetic fields generated in one antenna to affect electromagnetic fields generated in the other antenna, the two antennas may have a mutual inductance M.

As shown in FIG. 14, when the plasma generating apparatus 400 includes the impedance matcher 22, the impedance matcher 22 may include two output ports. Here, one may be connected to an input terminal of the first antenna 110, and the other one may be connected to an input terminal of the second antenna 120. Also, a capacitor 130 may be connected between the input terminal of the first antenna 110 and the input terminal of the second antenna 120.

According to an embodiment of the present invention, since the capacitor 130 is disposed between the input terminals of the first and second antennas 110 and 120, electrical coupling between the two antennas 110 and 120 constituting a dual antenna may be improved.

When the first and second antennas 110 and 120 are inductively coupled to each other to affect intensity and distribution of the electromagnetic fields therebetween, the capacitor 130 may allow the mutual inductance between the two antennas to have about 1, thereby uniformly distributing the electromagnetic fields over the plasma chamber 23.

According to an embodiment of the present invention, since the capacitor 130 is disposed between the input terminals of the first and second antennas 110 and 120, the impedance of the plasma antenna 100 may be changed. Thus, current flowing into the two antennas 110 and 120 may be uniform.

For example, as shown in FIG. 1, in a case where the two antennas have impedances different from each other because the first and second antennas 110 and 120 have coil diameters different from each other, the capacitor 130 may change the impedance of the antenna so that current having the same intensity flows into the two antennas.

Figure 15:
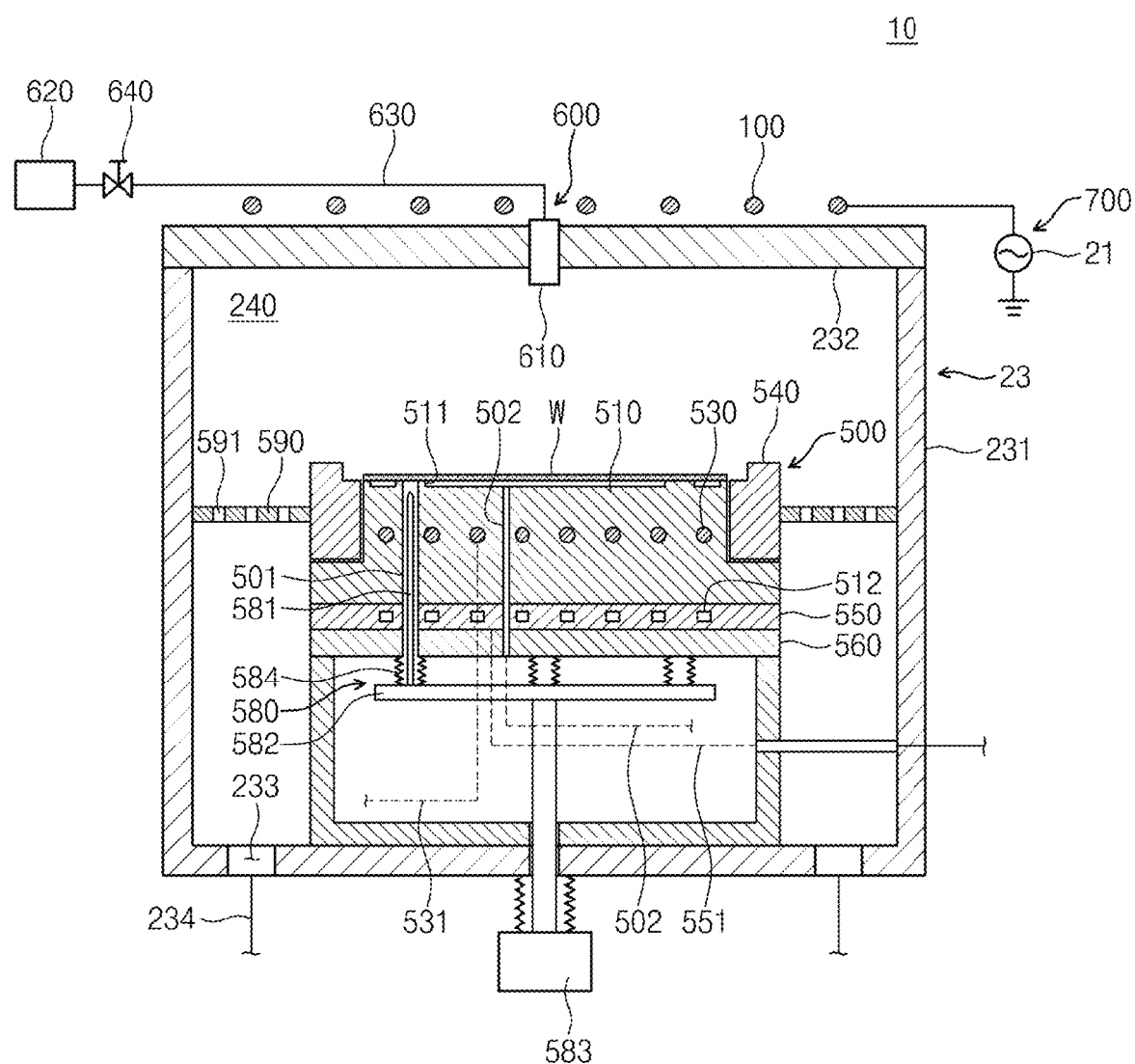
FIG. 15 is a cross-sectional view of a substrate treating apparatus including the plasma generating apparatus according to an embodiment of the present invention.

FIG. 15 is a cross-sectional view of a substrate treating apparatus including the plasma generating apparatus according to an embodiment of the present invention.

Referring to FIG. 15, a substrate treating apparatus 10 may include a plasma chamber 23, a substrate support unit 500, a gas supply unit 600, and a plasma source unit 700. The plasma chamber 23 may provide a space in which a plasma treating process is performed. The substrate support unit 500 may support a substrate W within the plasma chamber 23. The gas supply unit 600 may supply a process gas into the plasma chamber 23. The plasma source unit 400 may provide an electromagnetic wave into the plasma chamber 23 to generate plasma from the process gas.

The plasma chamber 23 may include a chamber body 231 and a dielectric cover 232. The chamber body 231 may have an opened top surface and an inner space. An exhaust hole 233 may be formed in a bottom wall of the chamber body 231. The exhaust hole 233 may be connected to an exhaust line 234 to provide a passage through which a gas staying in the chamber body 231 and byproducts generated during the process are discharged to the outside. The exhaust hole 233 may be provided in plurality of in an edge area of the bottom wall of the chamber body 231.

The dielectric cover 232 may seal the opened top surface of the chamber body 231. The dielectric cover 232 may have a radius corresponding to a circumference of the chamber body 231. The dielectric cover 232 may be formed of a dielectric material. The dielectric cover 232 may be formed of an aluminum material. A space surrounded by the dielectric cover 232 and the chamber body 231 may be provided as a treating space 240 in which a plasma treating process is performed.

The substrate support unit 500 may be disposed in the treating space 240 to support the substrate W. The substrate support unit 500 may fix the substrate W by using electrostatic force or support the substrate W in a mechanical clamping manner. Hereinafter, the method in which the substrate support unit 500 fixes the substrate W by using the electrostatic force may be described as an example.

The substrate support unit 500 may include an electrostatic chuck 510, a heater 530, a focus ring 540, an insulation plate 550, a ground plate 560, a housing 570, and a lift pin unit 580.

The electrostatic chuck 510 may have a disk shape. A top surface of the electrostatic chuck 510 may have a radius corresponding to that of the substrate W or less than that of the substrate W. Protrusions 511 may be disposed on the top surface of the electrostatic chuck 510. The substrate W may be supported by the protrusions 511 and be spaced a predetermined distance from the top surface of the electrostatic chuck 510. The electrostatic chuck 510 may be a stepped side surface so that a lower portion thereof has a radius greater than that of an upper portion.

The electrostatic chuck 510 may include an electrode. The electrode may be provided as a thin circular plate formed of a conductive material and connected to an external power source through a cable. Power applied from the external power source may form electrostatic force between the electrode and the substrate W to fix the substrate W to the top surface of the electrostatic chuck 510.

The heater 530 may be provided in the electrostatic chuck 510. The heater 530 may be disposed under the electrode. The heater 530 may be connected to the external power source through a cable 531. The heater 530 may resist against current applied from the external power source to generate heat. The generated heat may be transmitted into the substrate W via the electrostatic chuck 510 to heat the substrate W at a predetermined temperature. The heater 530 may be provided as a coil having a spiral shape. The heater 530 may be burred into the electrostatic chuck 510 at a constant distance.

The focus ring 540 may be provided in a ring shape and disposed along a circumference of an upper area of the electrostatic chuck 510. A top surface of the focus ring 540 may be stepped so that an inner portion thereof adjacent to the electrostatic chuck 510 is lower than an outer portion thereof. The inner portion of the top surface of the focus ring 540 may be disposed at the same height as the top surface of the electrostatic chuck 510. The focus ring 540 may expand a region in which the electromagnetic fields are formed so that the substrate W is located in a center of a region in which the plasma is formed. Thus, the plasma may be uniformly formed over an entire area of the substrate W.

The insulation plate 550 may be disposed under the electrostatic chuck 510 to support the electrostatic chuck 510. The insulation plate 550 may have a circular plate having a predetermined thickness and have a radius corresponding that the electrostatic chuck 510. The insulation plate 550 may be formed of an insulation material. The insulation plate 550 may be connected to an RF power source (not shown) through the cable 551. The RF current applied into the insulation plate 550 through the cable 551 may generate electromagnetic fields between the substrate support unit 500 and the dielectric cover 232. The electromagnetic fields may be provided as energy for generating plasma.

A cooling passage may be formed in the insulation plate 550. The cooling passage 512 may be disposed under the heater 520. The cooling passage 512 may provide a passage through which a cooling fluid is circulated. The heat of the cooling fluid may be transmitted into the electrostatic chuck 510 and the substrate W, and then the heated electrostatic chuck 510 and the substrate W may be quickly cooled. The cooling passage 512 may have a spiral shape. On the other hand, the cooling passage 512 may be provided as ring-shaped passages having radii different from each other and disposed with the same center. Each of the passages may communicate with each other. On the other hand, the cooling passage 512 may be disposed on the ground plate 560.

The ground plate 560 may be disposed under the insulation plate 550. The ground plate 560 may have a disk shape having a predetermined thickness and a radius corresponding to the insulation plate 550. The ground plate 560 may be grounded. The ground plate 560 may electrically insulate the insulation plate 550 from the chamber body 231.

A pin hole 501 and a purge gas supply hole 502 may be formed in the electrostatic chuck 510, the insulation plate 550, and the ground plate 560. The pin hole 501 may be provided from the top surface of the electrostatic chuck 510 to a bottom surface of the ground plate 560. The pin hole 510 may be provided in plurality. Also, lift pins 581 may be disposed in the pin holes 510, respectively.

The purge gas supply hole 502 may be provided in plurality. Also, the purge gas supply hole 502 may be provided from the top surface of the electrostatic chuck 510 to the bottom surface of the ground plate 560. The purge gas supply hole 502 may be connected to a purge gas supply line 503 to provide a passage through which a purge gas is supplied. The purge gas may be supplied into a space between the substrate W and the top surface of the electrostatic chuck 510. The purge gas staying between the substrate W and the electrostatic chuck 510 may improve heat transfer efficiency from the electrostatic chuck 510 to the substrate W. The purge gas may include an inert gas. The purge gas may be a helium gas.

The housing 570 may be disposed under the ground plate 560 to support the ground plate 560. The housing 570 may have a cylindrical shape having a predetermined height and an inner space. The housing 570 may have a radius corresponding to the ground plate 560. Various cables 503, 531, and 551 and the lift pin unit 580 may be disposed within the housing 570.

The lift pin unit 580 may load the substrate W onto the electrostatic chuck 510 or unload the substrate from the electrostatic chuck 510. The lift pin unit 580 may include a lift pin 581, a support plate 582, and a driving part 583. The lift pin 581 may be provided in plurality. Also, the lift pins 581 may be disposed in the pin holes 501, respectively. The lift pins 581 may vertically move along the pin holes 501 to load and unload the substrate W.

The support plate 582 may be disposed within the housing 570 to support the lift pins 581. The driving part 583 may elevate the support plate 582. The support plate 582 may vertically move by the driving part 583, and thus, the lift pins 581 may move along the pin holes 501.

A bellows 584 may be provided between the ground plate 560 and the support plate 582. The bellows 584 may surround a region of the lift pin 581 disposed within the housing 570. The bellows 584 may contract or expand according to the elevation of the support plate 582.

A baffle 590 may control a flow of the process gas within the chamber 23. The baffle 590 may have a ring shape and be disposed between the chamber 231 and the substrate support unit 500. Distribution holes 591 are formed in the baffle 590. The process gas staying within the chamber 23 may be introduced into the exhaust hole 233 by passing through the distribution holes 591. The flow of the process gas introduced into the exhaust hole 233 may be controlled according to a shape and arrangement of the distribution holes 591.

The gas supply unit 600 may supply the process gas into the chamber 23. The gas supply unit 600 may include a nozzle 610, a gas storage part 620, and a gas supply line 630.

The nozzle 610 may be mounted on the dielectric cover 232. The nozzle 610 may be disposed at a central area of the dielectric cover 232. The nozzle 610 may be connected to the gas storage part 620 through the gas supply line 630. A valve 640 may be disposed on the gas supply line 630. The valve 640 may open or close the gas supply line 630 to adjust a supply rate of process gas. The process gas stored in the gas storage unit 620 may be supplied into the nozzle 610 through the gas supply line 630 and then sprayed into the chamber 23 from the nozzle 610. The nozzle 610 may mainly supply the process gas into a central region of the treating space 240. On the other hand, the gas supply unit 600 may further include a nozzle (not shown) mounted on a sidewall of the chamber body 231. The nozzle may supply the process gas into an edge region of the treating space 240.

The plasma source unit 700 may generate plasma from the process gas. The plasma source unit 700 may include an antenna 100 and a power source 21.

The antenna 100 may be disposed on an upper portion of the chamber 23. The antenna 100 may be provided as a coil having a spiral shape. The power source 21 may be connected to the antenna 100 through a cable to apply high-frequency power to the antenna 100. As the high-frequency power is applied, the antenna 100 may generate an electromagnetic wave. The electromagnetic wave may be radially generated with respect to the antenna 100. The electromagnetic wave may be provided into the chamber 23. The electromagnetic wave provided into the chamber 23 may generate induced electrical fields within the chamber 23. The process gas may obtain energy required for ionization thereof from the induced electrical fields and then be converted into plasma. The plasma may be provided onto the substrate W and then used for an ashing or etching process.

According to the embodiments, the coupling between the two antennas constituting the dual antenna may be improved.

According to the embodiments, when the two antennas are inductively coupled to each other, the mutual inductance between the two antennas may be constantly maintained.

According to the embodiments, the balance of current flowing into the two antennas may be achieved.

According to the embodiments, even though the two antennas inductances different from each other, current having the same intensity may flow into the two antennas.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A plasma antenna comprising:
   a first antenna configured to induce electromagnetic fields;
   a second antenna configured to induce electromagnetic fields; and
   a capacitor connected between an input terminal of the first antenna and an input terminal of the second antenna, the capacitor having a male end, the capacitor configured to be above the first antenna,
   wherein the first antenna comprises a first RF feed having a pillar shape and a first coil connected to the first RF feed, the first RF feed having a female end configured to directly receive the male end of the capacitor, and
   wherein the second antenna comprises a second RF feed having a hollow pillar shape surrounding the first RF feed and a second coil connected to the second RF feed,
   wherein the capacitor includes,
      a first conductor having a pillar shape, the first conductor coaxial with respect to the first RF feed, and
      a second conductor having a hollow pillar shape surrounding the first conductor, the second conductor coaxial with respect to the second RF feed, and
   wherein the capacitor is configured to be attached to the first and second antennas,
      wherein the capacitor is configured to be attachable to or detachable from the first and second RF feed such that the male end couples the capacitor to the first RF feed, and the second conductor couples the capacitor to the second RF feed,
      wherein the first RF feed has a cylindrical shape, and the second RF feed has a hollow cylindrical shape surrounding the cylindrical shape, and
      wherein the first conductor, the first RF feed, the second conductor, the second RF feed, the male end, and the female end are coaxial with respect to each other.

2. The plasma antenna of claim 1, wherein the capacitor further includes a dielectric between the first conductor and the second conductor.

3. The plasma antenna of claim 2, wherein the dielectric includes a polymer or metal oxide.

4. The plasma antenna of claim 3, wherein the polymer comprises at least one of Teflon®, ULTEM®, or polyetheretherketone (PEEK).

5. The plasma antenna of claim 3, wherein the metal oxide comprises ceramic.

6. The plasma antenna of claim 5, wherein the ceramic comprises at least one of Al2O3 or ZnO.

7. The plasma antenna of claim 1, wherein the first antenna is configured to induce the electromagnetic fields by using an RF signal applied to the first RF feed, and
   wherein the second antenna is configured to induce the electromagnetic fields by using an RF signal applied to the second RF feed.

8. The plasma antenna of claim 1, wherein the male end of the capacitor protrudes from an end of the first conductor.

9. The plasma antenna of claim 1, wherein an RF power source is connected to the first antenna and the second antenna.

10. A plasma generating apparatus comprising:
    a plasma chamber in which a gas is injected, the plasma chamber configured to generate plasma; and
    a plasma antenna on the plasma chamber, the plasma chamber is configured to receive an RF signal from the plasma antenna to induce electromagnetic fields in the plasma chamber,
    wherein the plasma antenna includes,
    a first antenna configured to induce electromagnetic fields,
    a second antenna configured to induce electromagnetic fields, and
    a capacitor configured to be connected between an input terminal of the first antenna and an input terminal of the second antenna, the capacitor including a male end, the capacitor configured to be above the first antenna,
    wherein the first antenna comprises a first RF feed configured to receive the RF signal and having a pillar shape, the first RF feed including a female end configured to directly receive the male end of the capacitor, the first antenna comprising a first coil connected to the first RF feed,
    wherein the second antenna comprises a second RF feed configured to receive the RF signal and having a hollow pillar shape surrounding the first RF feed, the second antenna comprising a second coil connected to the second RF feed,
    wherein the capacitor includes,
       a first conductor having a pillar shape, the first conductor coaxial with respect to the first RF feed, and
       a second conductor having a hollow pillar shape surrounding the first conductor, the second conductor coaxial with respect to the second RF feed,
    wherein the capacitor is configured to be attached to the first and second antennas,
       wherein the capacitor is configured to be attachable to or detachable from the first and second RF feed such that the male end couples the capacitor to the first RF feed, and the second conductor couples the capacitor to the second RF feed,
       wherein the first RF feed has a cylindrical shape, and the second RF feed has a hollow cylindrical shape surrounding the cylindrical shape, and
       wherein the first conductor, the first RF feed, the second conductor, the second RF feed, the male end, and the female end are coaxial with respect to each other.

11. The plasma generating apparatus of claim 10, wherein the male end of the capacitor protrudes from an end of the first conductor.

12. The plasma generating apparatus of claim 10, wherein the capacitor further includes a dielectric between the first conductor and the second conductor.

13. The plasma generating apparatus of claim 10, wherein the first antenna is configured to induce the electromagnetic fields by using an RF signal applied to the first RF feed, and
    wherein the second antenna is configured to induce the electromagnetic fields by using an RF signal applied to the second RF feed.

14. The plasma generating apparatus of claim 10, further including an impedance matcher connected to the first antenna and the second antenna.

15. The plasma generating apparatus of claim 14, further including an RF power source connected to the impedance matcher.

16. A substrate treating apparatus comprising:
- a plasma chamber including a chamber body and a dielectric cover;
- a gas supply unit including a nozzle mounted on the dielectric cover;
- an RF power source;
- a plasma antenna;
- an impedance matcher between the RF power source and the plasma antenna;
- wherein the plasma antenna includes,
- a first antenna configured to induce electromagnetic fields;
- a second antenna configured to induce electromagnetic fields; and
- a capacitor connected between an input terminal of the first antenna and an input terminal of the second antenna, the capacitor having a male end, the capacitor configured to be above the first antenna,
- wherein the first antenna comprises a first RF feed having a pillar shape and a first coil connected to the first RF feed, the first RF feed having a female end configured to directly receive the male end of the capacitor, and
- wherein the second antenna comprises a second RF feed having a hollow pillar shape surrounding the first RF feed and a second coil connected to the second RF feed,
- wherein the capacitor includes:
  - a first conductor having a pillar shape, the first conductor coaxial with respect to the first RF feed, and
  - a second conductor having a hollow pillar shape surrounding the first conductor, the second conductor coaxial with respect to the second RF feed,
- wherein the capacitor is configured to be attached to the first and second antennas,
  - wherein the capacitor is configured to be attachable to or detachable from the first and second RF feed such that the male end couples the capacitor to the first RF feed, and the second conductor couples the capacitor to the second RF feed,
  - wherein the first RF feed has a cylindrical shape, and the second RF feed has a hollow cylindrical shape surrounding the cylindrical shape, and
  - wherein the first conductor, the first RF feed, the second conductor, the second RF feed, the male end, and the female end are coaxial with respect to each other.

17. The substrate treating apparatus of claim 16, wherein an RF signal applied to the first RF feed and an RF signal applied to the second RF feed are provided from the impedance matcher.

18. The substrate treating apparatus of claim 16, wherein the first antenna is configured to induce the electromagnetic fields by using an RF signal provided from the impedance matcher.

* * * * *